United States Patent [19]

Mantellina et al.

[11] Patent Number: 4,517,681
[45] Date of Patent: May 14, 1985

[54] DIGITAL TIMING UNIT

[75] Inventors: Calogero Mantellina, Cerro Maggiore; Daniele Zanzottera, Busto Garolfo, both of Italy

[73] Assignee: Honeywell Information Systems Inc., Milan, Italy

[21] Appl. No.: 474,915

[22] Filed: Mar. 14, 1983

[30] Foreign Application Priority Data

Mar. 22, 1982 [IT] Italy ............................. 20304 A/82

[51] Int. Cl.³ .............................................. H04L 7/08
[52] U.S. Cl. .................................... 375/106; 377/110; 328/129.1
[58] Field of Search ............... 375/106, 113, 114, 116; 377/107, 110; 328/129.1

[56] References Cited

U.S. PATENT DOCUMENTS 3,648,237  3/1972  Frey, Jr. et al. .................. 375/116
4,004,100  1/1977  Takimoto .......................... 375/115
4,093,997  6/1978  Germer ............................ 364/900

Primary Examiner—Robert L. Griffin
Assistant Examiner—Timothy K. Greer
Attorney, Agent, or Firm—N. Prasinos

[57] ABSTRACT

A digital timing unit for timing a data processing system or units thereof, wherein the output signals of a shift register are applied to a plurality of EXCLUSIVE OR gates ($G_1$) ... ($G_n$). The shift register is activated from a known state so that an electric transition signal is shifted through the register cells. A timing cycle is thus defined which is utilized to set the register in a second known state. Feedback and control logic are provided for activating the register independently of its state and keeping it in the state occurring at the end of a timing cycle until a new start signal is received. Shifting of the register is caused by timing pulses generated by an oscillator (1). The timing signals generated by the timing unit and present on the output terminals of the EXCLUSIVE OR may be modified, as to the length, by changing the oscillator period and/or the connection between the EXCLUSIVE OR inputs and the outputs of the shift register.

3 Claims, 3 Drawing Figures

DIGITAL TIMING UNIT

BACKGROUND OF THE INVENTION

1. Field of the Invention

The present invention relates to a digital timing unit for timing data processing systems or units thereof, particularly memory units.

2. Description of the Prior Art

It is known that the operation of data processing systems and of memory units coupled to them must be precisely timed. It is also known that, notwithstanding the project accuracy, some timing problems may occur during the prototype testing which require timing modifications. Additionally, because of the fast evolution in electronic technologies the speed performances of several integrated components are rapidly increasing. Because of the component evolution, therefore, a full exploitation of component performances requires matching of the timing to such component evolution. For instance, integrated memory circuits, available on the market in subsequent periods, may have the same external features (number of interconnecting pins, relative layout, signal transferred from a determined pin) but higher and higher working speed. Such integrated components are generally mounted on a supporting printed circuit board, which also includes the timing unit suitable to control such integrated components. Because of the evolution of memory component performances it is therefore necessary to redesign the timing unit and the supporting printing circuit unless the timing unit can be modified.

In the prior art electromagnetic delay lines with intermediate taps have been used as a basic element of the timing units. Such delay lines imposed fixed timing within each cycle, or the timing can be changed in a discrete way by selecting one among several possible intermediate taps. Moreover the attainable timing accuracy is limited by the relatively large tolerances of such components. In fact these components, even though unaffected by temperature changes and free from aging phenomena, may have a large spread in delay time even though they are of the same type and with the same nominal specifications.

Other timing units have been used which make use of an oscillator for the generation of basic timing pulses with predetermined frequency and have a counter which is advanced by the basic pulses. Timing pulses of a variable length multiple of the basic pulse period, can be obtained from the counter outputs, by means of suitable decoding logic networks. Moreover the timing can be modified in a continuous way, therefore proportionally modifying the length of all the timing pulses, by changing the oscillator frequency. A relative variation in the pulse length is, however, possible only after modifying the decoding logic network, which involves substantially redesigning the whole timing unit.

In an alternate embodiment disclosed, for example by U.S. Pat. No. 4,249,253, issued Feb. 3, 1981, cascade shift registers may be used instead of the counter. The registers are progressively loaded with a logical/electrical level which propagates through them. Even in this case the timing pulses are obtained from the shift register outputs by means of a decoding logic network with the above mentioned limits, and at the end of a timing cycle, the shift register must be reset to be ready for the subsequent cycle start. The reset operation simultaneously occurs on a great number of cells and involves a sudden current variation in each of the involved cells. The amount of the total current change causes the generation of electrical noise which may affect the correct working of the system logic circuits.

These undesirable effects are overcome by the digital timing unit of the present invention, which offers the following advantages: (a) it permits the generation of very precise timing pulses; (b) it permits the changing of timing pulse length in a continuous proportional way for all the timing pulses; (c) it permits changing the relative timing length of the timing pulses without substantial circuit modifications, the only change being in electrical interconnections; and (d) it does not cause electrical noise because it does not require reset operations.

OBJECTS OF THE INVENTION

It is an object of the invention therefore to provide an improved digital timing unit for data processing systems.

It is another object of the invention to generate very precise timing pulses.

It is still another object of the invention to permit changing the timing pulse length in a continuous proportional way for all timing pulses.

It is yet another object of the invention to permit the changing of the relative timing length of the timing pulses without substantial circuit modifications.

It is yet another object of the invention to minimize electrical noise.

SUMMARY OF THE INVENTION

These and other advantages are obtained by using a shift register wherein a logical/electrical transition of opposite kind; e.g., from 0 to 1 in one case and from 1 to 0 in the other one, is alternately shifted during subsequent timing cycles. The inputs of a plurality of identical logic circuits, are coupled to the logic function EXCLUSIVE OR, and are also coupled to the output of the shift register. The EXCLUSIVE OR outputs are preferably, even though not necessarily, connected to an alignment register which "synchronizes" one another's several timing pulses. The output from logic circuits, recover the timing spread due to the spread in propagation time of such logic circuits. The relative timing and the length of the several timing pulses may be modified by merely changing the electrical interconnections between shift register and logic circuits.

DETAILED DESCRIPTION OF THE PREFERRED EMBODIMENT

Figure 1:
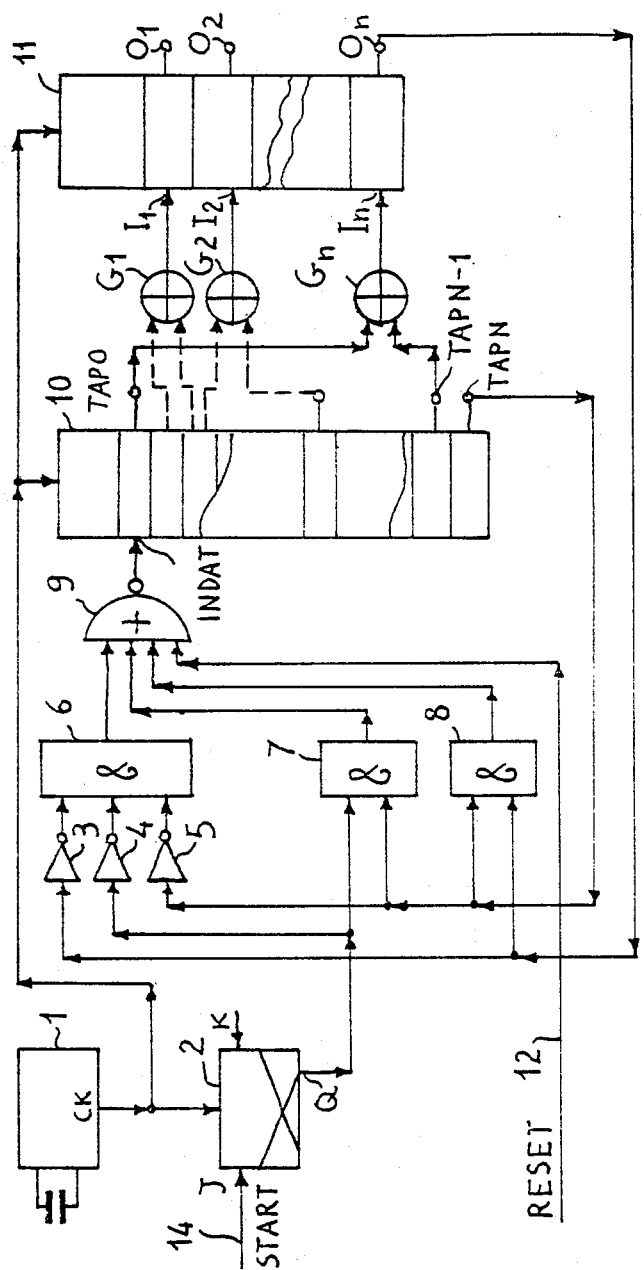
FIG. 1 shows a preferred embodiment of a digital timing unit according to the invention.

Referring now to FIG. 1, the timing units include: a quartz oscillator 1, a flip-flop 2, three NOT elements respectively (3, 4, 5), three AND gates (6, 7, 8) respectively with three inputs (AND gates 6) and two inputs (AND gate 7 and 8), a four input NOR gate 9, a shift register 10, a set of n EXCLUSIVE OR gates $G_1, G_2, \ldots, G_n$ and an auxiliary register 11. Shift register 10 has a data input terminal INDAT and a set of output terminals TAPO, TAPN. Auxiliary register 11 has a set of input terminals $I_1, \ldots I_n$ and a corresponding set of output terminals $O_1, \ldots, O_n$.

The above mentioned elements are interconnected as follows: The output terminal of oscillator 1 is connected to the clock input terminal of flip-flop 2 and of register 10, 11. The direct output terminal Q of flip-flop 2 is connected to a first input of AND gate 7 and to the input of NOT 4, whose output is connected to a first input terminal of AND gate 6. The output terminal TAPN of register 10 is connected to a first input terminal of AND gate 8, to a second input terminal of AND gate 7, as well as to the input terminal of NOT 5, whose output is connected to a second input terminal of AND gate 6. The output terminal O of register 11 is connected to a second input terminal of AND gate 8 and to the input terminal of NOT 3, whose output terminal is connected to the third input terminal of AND gate 6. The output terminal of AND gate 6, 7, 8 is respectively connected to three input terminals of NOR gate 9. NOR gate 9 receives, through lead 12, an external RESET signal for initialization purpose. The output of terminal of NOR gate 9 is connected to the data input terminal INDAT of shift register 10. Output terminals TAPO, . . . TAPN, of shift register 10, are suitably connected in pairs to the input terminals of the n EXCLUSIVE OR gates $G_1 \ldots G_n$ depending on the timing requirements. Such interconnections are intentionally shown in dotted lines in order to show that the actual connections are not relevant to the invention. A fixed connection is made between terminal TAPO and a first input terminal gate $G_n$ and between terminal TAPN−1 and the second input of gate $G_n$. The output terminals of gates $G_1 \ldots G_n$ are respectively connected to input terminals $I_1 \ldots I_n$ of register 11. Flip-flop 2 of JK type receives a START signal at input terminal J, through lead 14.

The operation of the timing unit is as follows: As soon as the unit is powered, oscillator 1 starts the generation of a sequence of square wave pulses with a characteristic period T; e.g., 30 nsec. and continues indefinitely as long as it is powered. Oscillator pulses trigger flip-flop 2 and registers 10, 11 to load the signal present at their respective inputs. If signal START on lead 14 is missing, flip-flop 2 will therefore remain in the reset state. Register 10 is forced in a known initial reset status where each of its cells is at logical/electrical level 0, by means of a RESET pulse applied on lead 12 and having a length at least equal to T(N+1) where T is the oscillator period and (N+1) the cell number of shift register 10. The result is that at the end of such pulse all the outputs $G_1, \ldots, G_n$ of the EXCLUSIVE OR are at logical/electrical level 0 as well as register 11 outputs. The logical level 0 present at terminal TAPN inhibits AND gates 7 and 8, and on all the inputs of AND gate 6, a logical/electrical level 1 is present. This is because the output Q of flip-flop 2 is at logical level 0 as well as the terminal TAPN and the output $O_n$ of register 11. The result is that, even though the reset pulse ends, AND gate 6 supplies a logical level 1 to the input of NOR 9 which supplies, in turn, a logical level 0 to INDAT input of shift register 10 which is maintained, during the subsequent clock pulses in a discharged status.

Figure 2:
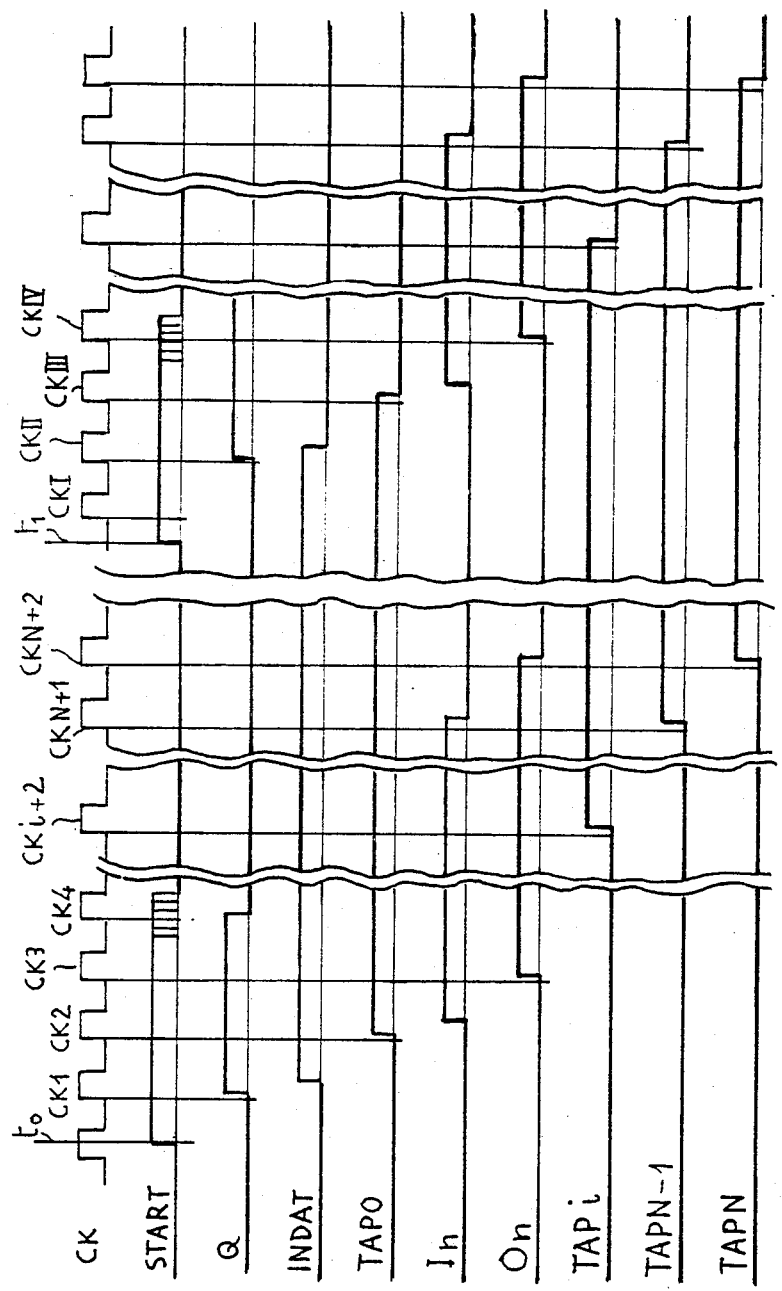
FIG. 2 shows a timing diagram of the logical electrical level of a signal present at the different points of the unit in FIG. 1.

Such initial status is shown by timing diagram of FIG. 2, where:

the logical/electrical level of output Q is shown by diagram Q;

the logical/electrical level at the input J of flip-flop 2 is shown by diagram START;

the timing pulses in output from oscillator 1 are shown by diagram CK;

the logical/electrical level at the output of NOR gate 9 is shown by diagram INDAT;

the logical/electrical level at terminals TAPO, TAPi, TAPN−1, TAPN, is respectively shown by diagram TAPO, TAPi, TAPN−1, TAPN.

the logical/electrical level at input $I_n$ of register 11 is shown by diagram $I_n$.

the logical/electrical level at output $O_n$ of register 11 is shown by diagram $O_n$.

If at instant $t_0$, to START pulse is applied to flip-flop 2, with the rising edge of the subsequent clock pulse (CK1), flip-flop 2 is set and output Q rises to logical level 1. The result is that the output of NOR 4 falls to logical level 0 as well as the output of AND gate 6. Thus the output of NOR gate 9 rises to logical level 1. These transitions obviously occur with a certain delay as to clock CK1, but before the starting of the subsequent clock CK2. With clock CK2, a logical level 1 is therefore loaded in the first cell of shift register 10 and terminal TAPO rises to logical level 1. Since terminal TAPN−1 is still at logical level 0, the output of EXCLUSIVE OR $O_n$ rises to logical level 1 with a certain propagation delay (diagram $I_n$). With subsequent clock CK3, logical level 1, which is present at input $I_n$, is loaded in cell n of register 11 and is available at output $O_n$. Likewise a logical level 1 will be present at all outputs Oi of register 11 which have the corresponding inputs Ii at logical level 1. This occurs in case other gates Gi, in addition to gate $G_n$, have an input connected to terminal TAPO. Therefore with clock CK3 the logical level 1 present at output ON inhibits AND gate 6 and imposes a logical level 1 at the output of NOR 9 independently from the logical level present at output Q which is masked. Therefore, immediately after clock CK3 the START pulses may be dropped to 0 and flip-flop 2 may be reset by the subsequent clock pulse. In other words START pulse must have a minimum length greater than three clock periods. By means of clock pulse CK3 logical level 1 present in the first cell of register 10 propagates in the second cell while the first one maintains its logical level 1, so that TAPN 1 too rises to logical level 1. During the subsequent clock pulse CKi+2 the signals on the several terminals TAPi rise to logical level 1. In other words the logical level 1 propagates in shift register 10 and produces, because of the connections between terminals TAPi and inputs of gates Gi, the generation of timing signals of a predetermined length which develop in a timing cycle. Such signals are transferred, for use by external circuits, through register 11. The function of register 11 is to synchronize the start and the end of timing signals with clock pulses, avoiding the spread which may be caused by gates Gi because of the different propagation times such gates may have. In fact, register 11 may comprise a single integrated circuit or a number of them. It is well known that within the same integrated circuit the spread in propagation time of its functional elements is minimum. By means of clock pulse CKN+1 logical level 1 is loaded into cell N−1 of register 10 and therefore the signal on terminal TAPN−1 rises to logical level 1 while the output signal of gate $G_n$ falls to logical level 0. With subsequent clock CKN+2 the timing cycle ends. Output $O_n$ of register 11 falls to logical level 0 while terminal TAPN rises to logical level 1. During the subsequent clock pulses, if a new command START is missing, the shift register does not change its status. In fact logical level 1 present at terminal TAPN imposes a logical level 0 at the output of AND gate 6, independently from the logical level present at outputs Q and $O_n$. At the same time a logical level 0 present at output $O_n$ inhibits AND gate 8 while the logical level present at output Q inhibits AND gate 7. The output of NOR gate 9 is therefore maintained at logical level 1. If now a new START signal is applied to the timing unit (instant $t_1$) flip-flop 2 is set again by the subsequent clock pulse CKI. Consequently the output of AND gate 7 rises to logical level 2 and the output of NOR gate 9 falls to logical level 0. By means of clock pulse CK II a logical level 0 is therefore loaded in the first cells of shift register 10 and during the subsequent clocks it propagates in the other cells. Therefore a new timing cycle starts during which timing signals are generated identical to the ones generated during the previous cycle. In fact the EXCLUSIVE OR circuits are, by nature, sensitive to differences in logical levels present at the inputs but not to their arrangement. In a similar manner when the clock pulse CK III is issued, the logical level 1, present on both output $O_n$ and terminal TAPN, imposes a logical level 1 to the output of AND gate 8. A logical level 0 is produced at the output of NOR gate 9, independently from the logical level present at output Q. Thus, even in this case the signal START can be removed. Finally, as soon as level 0 propagates in register 10, logical level 0 present at terminal TAPN, at the output $O_n$ and at output Q, and applies a logic level 1 to the output of AND gate 6 and consequently a logic level 0 to the output of NOR 9. Therefore shift register 10, during the subsequent clock is maintained in a discharged status until a new START signal is received.

Having explained the operation of the timing unit, some relevant observations should be made. In prior art timing units each timing cycle starts from one predetermined state of the timing unit. The instant invention, however, may perform identical timing cycles starting from *two possible* initial states and terminating in *one of two possible states*. To this end a start command received by the unit enables the unit itself to pass from an initial state to another one. An output signal from gate $G_n$ may be considered a feedback signal which maintains the unit enabled, even though the start command is removed, for the time necessary to complete the timing cycle. The output signal from terminal TAPN may be considered a feedback signal which maintains the timing unit in *one of the two possible initial states* reached at the end of a cycle. In the units known in the prior art, however, a feedback signal always resets the unit in the same state. The generation of identical timing signal during a timing cycle started from a different state is performed by means of EXCLUSIVE OR coupled to shift register 10. It is clear by reading the foregoing that the circuit formed by gates 6, 7, 8, 9 and by NOT 3, 4, 5 and by flip-flop 2 can be embodied by different components, provided that the same operation is performed, that is:

to send a start signal enabling the shifting register to pass from a first to a second state, to maintain such transition enabled even after the start signal is removed, to maintain the shift register in the state reached at the end of the transition until the receiving of a new start command.

As already mentioned, register 11 too is not essential for the invention. In case register 11 is not included in the timing unit, EXCLUSIVE OR input $G_n$ is connected to a terminal TAPN. In case the start signals received by the unit are sufficiently long the connection of an input of gate $G_n$ to terminal TAPO may be replaced by the connection to an intermediate terminal TAPi.

Figure 3:
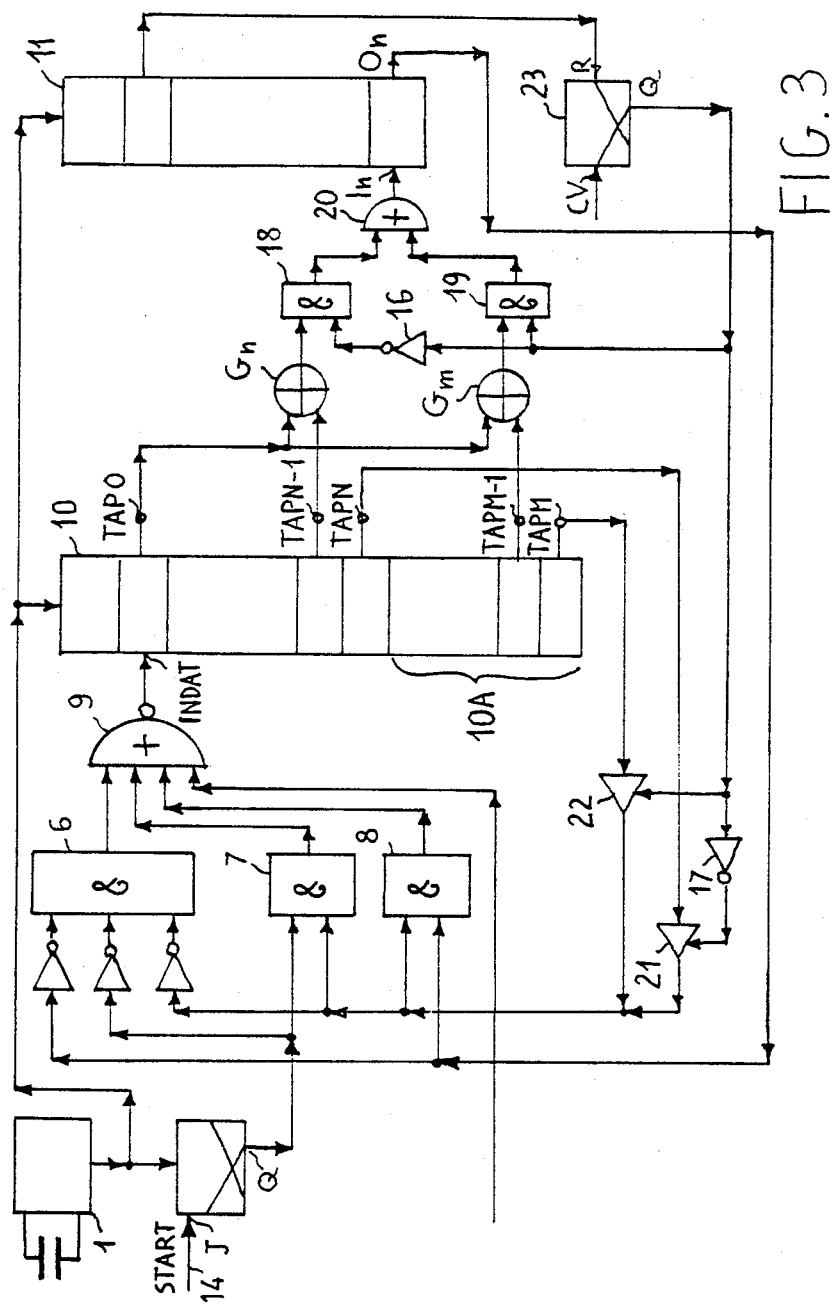
FIG. 3 shows a variant to timing unit in FIG. 1.

Finally the described timing unit may be modified for generation of timing cycles of different length according to conditions or events which may occur during a cycle. FIG. 3 shows a variant to timing unit of FIG. 1 for the purpose of generating timing cycles of different length. Timing unit 3 includes all the circuit elements of FIG. 1 identified by the same numbers and further includes additional elements. For the elements previously discussed no further description will be made.

Referring to FIG. 3 shift register 10 comprises a "tail" 10A with M cells, each one having an output terminal TAPN+1, . . . , TAPM. It also comprises a suitable number of additional EXCLUSIVE OR gates, of which only the EXCLUSIVE OR $G_m$ is shown, two NOT circuits 16, 17, two AND gates 18, 19, an OR gate 20, two transferring gates of "tristate" type 21, 22 and an RS type flip-flop 23. Input terminals of EXCLUSIVE OR $G_m$ are respectively connected to terminals TAPO and TAPM−1. The output terminals of EXCLUSIVE OR $G_n$ and $G_m$ are respectively connected to a first input of AND gates 18, 19 whose outputs are connected to the inputs of OR 20. The output terminal of OR 20 is connected to input $I_n$ of register 11. Flip-flop 23 receives at its set input terminal a signal of verified condition CV and at its reset input terminal a timing signal from a cell of register 10. Such timing signal is generated at the beginning of each timing cycle and causes or confirms the reset state of flip-flop 23. Direct output terminal 01 of flip-flop 23 is connected to a second input terminal of AND gate 19 and to the enabling input terminal of tristate 22. It is also connected to the input terminal of NOT 16 and 17 whose output terminal is respectively connected to the second input of AND gate 18 and to the control input of tristate 21. The input terminal of tristate 21, 22 is respectively connected to terminals TAPN and TAPM and the outputs are connected together, to the input of NOT 5 and to an input of AND gates 7, 8. It is clear from FIG. 3 that during a timing cycle if the condition CV, which requires an extension of the timing cycle, does not occur, flip-flop 23 is maintained in a reset state and gate 19 is inhibited as well as tristate 22. Gate 18 and tristate 21, however, are enabled. Therefore the timing unit performs similar to the one of FIG. 1. However, if during a timing cycle, flip-flop 23 is set and AND gate 19 and tristate 22 are enabled. The action performed by EXCLUSIVE OR $G_n$ is carried out by the EXCLUSIVE OR $G_m$ and the signal in output from terminal TAPM substitutes for the signal in output from terminal TAPN. The length of a timing cycle is therefore extended for M clock periods. It should be understood that during such timing cycle extension additional timing signals may be generated and some timing signals, already started during the normal cycle, may be extended. In case of a non-extended cycle, such additional signals or such extensions may be masked at the output of the EXCLUSIVE OR which generates them, by means of logic circuits similar to the one used to mask the output of gate $G_m$. In case condition CV occurs within each cycle with a delay, referencing the start of the cycle, sufficient for a level transition to propagate from the beginning to the end of tail 10A, the presence of tail 10A in shift register 10 does not prevent a timing cycle from starting which immediately follows the end of a previous short unextended cycle. It should be understood that when a timing unit is designed to supply a certain number n of timing signals at outputs $O_1 \ldots O_n$, the length and the relative timing of such signals may be varied as follows. For proportional variations of all the timing pulses, it suffices to change the oscillator 1 period. For variation of relative length it is possible to modify the start and the end of the timing signals according to discrete values equal to the oscillation period T by changing the connections among the terminals TAPi and the input of gates Gi. This may be carried out by the modification of the printing circuit supporting the components or by effecting such connections through straps changeable according to the needs. Obviously it is possible to carry out combined timing modifications by acting both on the oscillator period and on the connections.

A list of preferred components available on the market for implementation of the timing unit object of the invention is supplied.

Oscillator 1: Integrated circuit K115A manufactured by U.S. firm Motorola. It has a maximum oscillation frequency of 70 MHz.

Flip-flop 2, 23: Integrated circuit 74S112 manufactured by U.S. firm Fairchild. The integrated component includes two JK flip-flops having further a set/reset direct input. The typical propagation time of the components is 5 ns.

AND 6, 7, 8 and NOR 9: The AND NOR integrated circuit having code 74F64 and manufactured by Fairchild may be used. The propagation time of the component is 4, 5 nsec.

AND 18, 19: The integrated circuit with code 74F08 manufactured by Fairchild may be used. The propagation time of the component is 4 nsec.

NOT 3, 4, 5, 16, 17: Integrated circuit 74F04 manufactured by U.S. firm Fairchild. The component includes 6 NOT. The propagation time of the component is 3, 5 nsec.

Register 10, 10A, 11: Integrated circuit 74F374 manufactured by Fairchild. The component includes 8 cells. The propagation time of the component is 5, 5 nsec. The register may be used as shift register by connecting the output of each cell (TAPi) to the input of the subsequent cell. The component is further characterized by the absence of "spikes" or output level transitions in correspondence of the loading clocks, when the output logical level does not change. Registers with greater capacity are obtained by arranging several components of such kind in parallel or in cascade (in case of shift registers).

OR 20: Integrated circuit 74F32 manufactured by Fairchild. The component includes 4 OR with two inputs. The propagation times of the component is 4 nsec.

Tristate 21, 22: Integrated circuit 74F241 manufactured by Fairchild. The component includes 8 tristates.

EXCLUSIVE OR $G_i$: Integrated circuit 74F86 manufactured by Fairchild. Propagation time 5 nsec. The component includes 4 EXCLUSIVE OR.

Considering the propagation time of the above components it appears that such circuits permit the implementation of a timing unit having a typical clock period of about 16 nsec. in case of FIG. 1 and of about 23 nsec. in case of FIG. 3.

Having shown and described one embodiment of the invention, those skilled in the art will realize that many variations and modifications can be made to produce the described invention and still be within the spirit and scope of the claimed invention. It is the intention, therefore, to be limited only as indicated by the scope of all of the claims.

What is claimed is:

1. A digital timing unit comprising a shift register having a plurality of N ordered cells, the shift register having a first cell input and an output for each cell, and further having a clock input terminal for loading a logical signal level in the first cell and also shifting the logical content of a cell for each received clock pulse, said digital timing unit further including a clock pulse generator for providing at its output a sequence of clock pulses having a predetermined frequency, said clock pulses being fed to said clock input terminal, said timing unit further comprising:

a plurality of EXCLUSIVE OR circuits, each having an input pair and an output, the input pair of said EXCLUSIVE OR circuits being connected to a predetermined output pair of said shift register;

logic circuit means having input terminals for receiving:

(a) an external start signal having a predetermiined binary level;

(b) a first feedback signal in output from the output of a predetermined one of said cells;

(c) a second feedback signal in output from the output of a predetermined one of said EXCLUSIVE OR circuits;

said logic circuit means having an output terminal connected to said first cell input of said shift register;

said logic circuit means supplying said first cell input terminal with one of two levels of a binary output signal, switching from one level to the other said output signal on reception of said start signal, maintaining said other level at said output terminal and concurrently masking any other possible start signal, until said other level is shifted into said predetermined one of said cells, and further maintaining said other level at said output terminal, following the shifting of said other level into said predetermined one of said cells, until another start signal is received.

2. A digital timing unit as recited in claim 1 further comprising a synchronization register, having a plurality of input each one connected to the output terminal of one of said EXCLUSIVE OR circuits, and a clock input connected to the output terminal of said clock pulse generator.

3. A digital timing unit as recited in claim 1 further comprising second logic circuit means having input terminals for receiving a binary selection signal; said first and second feedback signals, a third feedback signal in output from the output of a second predetermined one of said cells, and a fourth feedback signal in output from the output of a second predetermined one of said EXCLUSIVE OR circuits, said second logic circuit means operating to transfer in a mutually exclusive manner to said first logic circuit means, depending on the logic level of said binary selection signal, said first and second feedback signals or said third and fourth feedback signals.

* * * * *